OSCILLATOR FREQUENCY CONTROL USING CURRENT CONTROLLED
INTERNAL TRANSISTOR CAPACITANCE
Filed Feb. 29, 1968

United States Patent Office 3,550,037
Patented Dec. 22, 1970

3,550,037
OSCILLATOR FREQUENCY CONTROL USING CURRENT CONTROLLED INTERNAL TRANSISTOR CAPACITANCE

Zbigniew Wiencek, Palatine, Ill., assignor to Hazeltine Research, Inc., a corporation of Illinois Filed Feb. 29, 1968, Ser. No. 709,381
Int. Cl. H03b *5/12, 5/36*
U.S. Cl. 331—116 6 Claims

ABSTRACT OF THE DISCLOSURE

A transistorized oscillator circuit in which a variable current is supplied to the transistor to vary the magnitude of the internal base-emitter capacitance. This capacitance is used in combination with other reactance such as a piezoelectric crystal or an inductance in determining the oscillation frequency so that variation of its magnitude controls the frequency of oscillation.

BACKGROUND OF THE INVENTION

This invention relates to oscillators, and more particularly, to oscillators whose frequency of oscillation varies in accordance with variations in the magnitude of a supplied control current.

In oscillators in which the frequency or phase must be controlled very accurately, maintenance of the frequency and phase of oscillation is often accomplished by voltage controlled devices. In color television, for example, the phase of the local oscillator circuit must be synchronized to the phase of a received color burst signal. In one arrangement, a voltage proportional to the phase difference between the local oscillator and color burst signal is coupled to the grid of a reactance tube to vary its reactance, and thus the phase of oscillation, until the difference voltage is reduced to a value which indicates synchronization. However, inclusion of additional circuit elements such as the reactance tube requires both additional space and cost, and also results in greater power consumption.

SUMMARY OF THE INVENTION

Objects of the present invention are therefore to provide a new and useful oscillator which provides simple control of the frequency of oscillation and reduces the number of circuit elements required.

Thus, in accordance with the invention there is provided an oscillator circuit which utilizes a current dependent capacitance for providing a variable frequency of oscillation. The circuit includes an active semiconductor device having a current dependent internal capacitance between its first and second terminals. The circuit also includes impedance means coupled to the semiconductor device for determining, together with the internal capacitance, the frequency of oscillation of the circuit. The circuit further includes means, coupled to first and second terminals of the device, for supplying a variable control current for varying the magnitude of the internal semiconductor capacitance to control the frequency of oscillation.

BRIEF DESCRIPTION OF THE DRAWING

Referring to the drawing.

DESCRIPTION OF THE INVENTION

Figure 1:
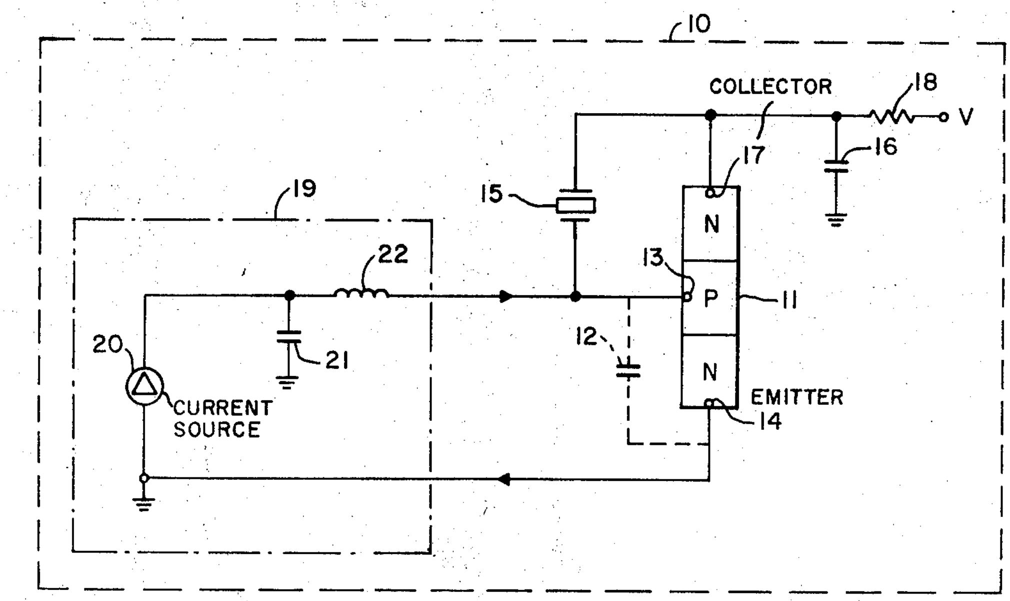
FIG. 1 is one embodiment of an oscillator circuit constructed in accordance with the present invention.

Description of the circuit of FIG. 1

Referring to FIG. 1 there is shown circuit 10, one example of an oscillator circuit constructed in accordance with the present invention, which utilizes a current dependent capacitance for providing a variable frequency of oscillation. Circuit 10 includes an active semiconductor device, transistor 11, having a current dependent internal capacitance represented by capacitor 12, between base terminal 13 and emitter terminal 14 thereof.

Circuit 10 also includes impedance means shown as crystal 15 and capacitor 16, for determining, together with capacitor 12, the frequency of oscillation of circuit 10. In particular, crystal 15 is shown connected between base terminal 13 and collector terminal 17 which is connected through resistor 18 to supply voltage V. Capacitor 16 is connected between collector terminal 17 and a reference potential shown as ground.

Circuit 10 further includes means 19 coupled to base terminal 31 and emitter terminal 14 of transistor 11, for supplying a variable control current for varying the magnitude of capacitor 12 to control the frequency of oscillation.

Means 19 includes a source of control current 20 and a bypass capacitor 21 in parallel combination between a reference potential, shown as ground, and one end of an inductive element, shown as inductor 22. Bypass capacitor 21 is of appropriate magnitude to prevent rapid variations in the current supplied by source 20, and inductor 22 is of sufficient impedance in the range of operating frequencies to prevent the A-C signal at base terminal 13 of transistor 11 from being shunted to ground. The D-C portion of the control current supplied by current source 20 flows through inductor 22 to base terminal 13 of transistor 11. Variation in the magnitude of this current causes a corresponding variation in the magnitude of internal capacitor 12, thereby controlling the frequency of oscillation of circuit 10.

Figure 2:
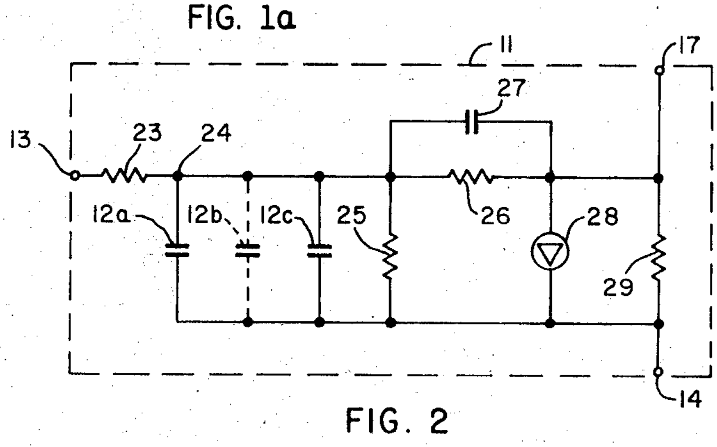
FIG. 2 depicts a hybrid-pi model which is a high frequency equivalent circuit of the transistor of FIGS. 1 and 1*a*.

Description of the circuit of FIG. 2

Referring to FIG. 2, there is shown one version of a conventional hybrid-pi equivalent circuit model for transistor 11 of FIG. 1. This model is a high frequency configuration, which is used to facilitate describing the operation of transistor 11. Briefly stated, the model includes base terminal 13, collector terminal 17, and emitter terminal 14, which correspond to like terminals in FIG. 1. Base resistor 23 is shown connected between base terminal 13 and intrinsic base 24. Diffusion capacitor 12*a*, gain-amplification capacitor 12*b*, base-emitter depletion layer capacitor 12*c*, and emitter-base resistor 25 are all connected in parallel between intrinsic base 24 and emitter terminal 14. Base-collector resistor 26 and base-collector capacitor 27 are connected in parallel between intrinsic base 24 and collector terminal 17. Second current source 28 and collector-emitter resistor 29 are connected in parallel between collector terminal 17 and emitter terminal 14.

The magnitude of capacitor 12 of FIG. 1 is the sum of the magnitudes of capacitors 12*a*, 12*b*, and 12*c*. The magnitudes of both depletion layer capacitor 12*c* and base-collector capacitor 27 are related to the particular construction of transistor 11, and are relatively independent of the current flow therethrough. The magnitude of capacitor 12*b* which represents the gain-amplification or Miller-effect capacitance and is shown dotted, is substantially the product of the magnitude of base-collector capacitor 27 and the quantity $(1+gmR_L)$; where $R_L$ represents the equivalent external or "load" impedance between collector terminal 17 and emitter terminal 14 of transistor 11, and *gm* represents the transconductance of transistor 11. This transconductance, and therefore the magnitude of capacitor 12*b*, is proportional to the current through both emitter terminal 14 and base terminal 13.

The magnitude of resistor 25 decreases with an increase in base or emitter current, and since the product of the magnitudes of diffusion capacitor 12*a* and base-emitter resistor 25 is substantially constant, the magnitude of diffusion capacitor 12*a* is proportional to the magnitude of the current through emitter terminal 14 and base terminal 13. When the magnitude of the control current supplied by means 19 to base terminal 13 is varied, these proportionality effects cause a corresponding variation in the magnitudes of diffusion capacitor 12*a* and gain-amplification capacitor 12*b*, thereby varying the overall capacitance of capacitor 12 to control the frequency of oscillation.

Operation of the circuit of FIG. 1

An oscillator circuit such as circuit 10 in FIG. 1, may, for convenience, be referred to as a Colpitts-Pierce oscillator configuration. In such circuits, a crystal such as crystal 15 is frequently used to provide extreme frequency stability. The equivalent circuit for crystal 15 includes inductive and capacitance elements so that crystal 15 which may, for example, be a piezoelectric crystal, is used in determining the frequency of oscillation. In circuit 10, crystal 15 may be operated at a frequency just slightly below its parallel resonant frequency so that it will appear as an inductive element. Although FIG. 1 depicts the present invention as embodied in a high frequency crystal controlled oscillator, the teachings of this invention are applicable to various types of both crystal and noncrystal controlled oscillator circuits, some examples of which will be discussed in detail with reference to subsequent figures. As shown in FIG. 1 the magnitudes of capacitor 16, capacitor 12, and crystal 15 operating as an inductive element, determine the frequency of oscillation of circuit 10. If the magnitudes of the inductive element of crystal 15, and capacitors 12 and 16 are denoted L, $C_1$, and $C_2$, respectively, the square of the approximately natural frequency of oscillation of circuit 10 may be stated as:

$$\omega^2 \doteq (1/L)[(C_1+C_2)/(C_1C_2)] \qquad (1)$$

The sum of the magnitudes of capacitors 12*a*, 12*b*, and 12*c*, as previously stated, represent the magnitude of capacitor 12 which denotes the internal capacitance of transistor 11. As also noted, the control current supplied by means 19 to base terminal 13 flows therethrough to emitter terminal 14. Therefore, varying the magnitude of this control current will cause the sum of the magnitudes of capacitors 12*a* and 12*b* to also vary. This results in a corresponding variation in the magnitude of $C_1$—thereby varying or controlling the frequency of oscillation of circuit 10.

Figure 1A:
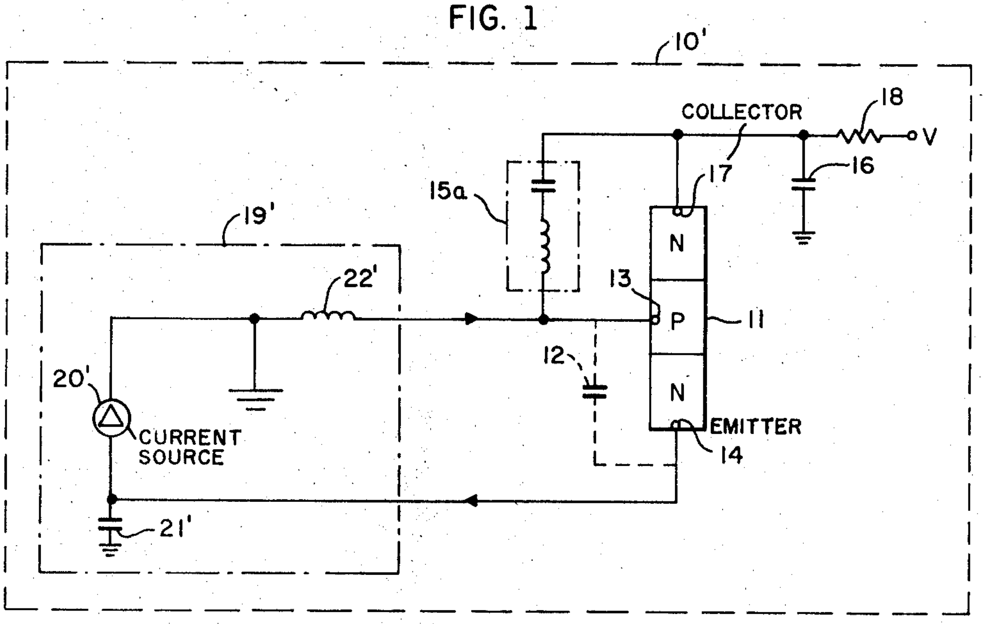
FIG. 1*a* is another embodiment of the oscillator circuit constructed in accordance with the invention.
Figure 1B:
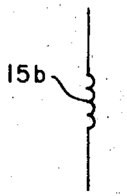
FIG. 1*b* depicts an element usable in conjunction with the circuits of FIGS. 1*a* and 1*b* to provide other embodiments constructed in accordance with the invention.

Description and operation of the circuit of FIGS. 1*a* and 1*b*

Circuit 10′ which also embodies the invention, is a variation of circuit 10 of FIG. 1. However, element 15*a* of FIG. 2, which comprises an inductor and a capacitor in series, is connected between base terminal 13 and collector terminal 17 of transistor 11 in lieu of the crystal 15 of FIG. 1. In addition, means 19′ is shown as a variation of means 19 of FIG. 1 and includes elements 20′, 21′, and 22′, which may have values different from those of elements 20, 21 and 22, respectively. Means 19′ supplies the control current to base terminal 13. However, current source 19′ is actually operating as a current "sink," controlling the current flow at emitter terminal 14, thereby controlling the current flow through inductor 22′ to base terminal 13. Inductor 22′ provides impedance between base terminal 13 and ground in the range of operating frequencies to prevent signals at base terminal 13 from being shunted to ground, and bypass capacitor 21′ prevents rapid variation in the current flow from emitter terminal 14 to current source 20′.

If $C_1$ and $C_2$ respectively denote capacitors 12 and 16, as in FIG. 1 and if L and C respectively denote the inductor and capacitor of unit 15*a*, the square of the approximate natural frequency of oscillation of circuit 10′ may be stated as:

$$\omega^2 \doteq \frac{1}{LC} + \frac{1}{L}\frac{(C_1+C_2)}{(C_1C_2)} \qquad (2)$$

FIG. 1*b* depicts an inductor 15*b* which may be substituted for crystal 15 of circuit 10 or unit 15*a* of circuit 10′. The resulting circuit with only an inductor for unit 15 is referred to as a Colpitts-type circuit. The natural frequency of oscillation of such a circuit may be obtained from Equation 1 used in circuit 10 of FIG. 1, where L denotes the magnitude of inductor 15*b*. Regardless of whether units 15, 15*a*, or 15*b* are employed, the frequency of oscillation of the circuit may be controlled.

If transistor 11 of FIGS. 1 and 2 was a PNP type instead of NPN as shown, means 19 and means 19′ for supplying a control current would supply this current to emitter terminal 14 of transistor 11. In one such embodiment, means 19 would be as shown in FIG. 1, except that current source 20 would operate as a current "sink," in much the same manner as does current source 20′, to control the current flow at base terminal 13 and emitter terminal 14. In another embodiment, means 19′ would be as is shown in FIG. 1*a* with current source 20′ supplying current to emitter terminal 14 to control the current flow. In both instances, appropriate modifications would be made to supply voltage V.

It should also be noted that various other configurations may be used for supplying the requisite control current to transistor 11. For example, in a color television receiver, the control current could be supplied by a phase detector which compares the phase of the local television oscillator circuit to that of the color burst signal.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An oscillator circuit which utilizes a current dependent capacitance for providing a variable frequency of oscillation, comprising:

a transistor having a current dependent internal capacitance between base and emitter terminals thereof;

a crystal coupled between base and collector terminals of said transistor for use in determining the frequency of oscillation of the circuit;

a capacitive element coupled between said collector terminal and a reference potential for determining, together with said crystal and said internal transistor capacitance, the frequency of oscillation of the circuit;

means coupled to the base and emitter terminals of said transistor for supplying a variable control current for varying the magnitude of said internal capacitance to control the frequency of oscillation.

2. An oscillator circuit as described in claim 1, wherein the recited capacitive element is a first capacitive element, and the current supplying means includes a source of control current and a second capacitive element in parallel combination between the reference potential and one end of an inductive element, and the other end of the inductive element is coupled to the base terminal of said transistor so that the D-C portion of the control current flows through said inductive element to said base terminal to control the frequency of oscillation.

3. An oscillator circuit as described in claim 1, wherein the recited capacitive element is a first capacitive element and the current supplying means includes a source of control current, operating as a current sink, and a second capacitive element in parallel combination coupled between the emitter terminal of said transistor and the reference potential, and an inductive element coupled between said base terminal and the reference potential for providing an impedance therebetween through which the control current is supplied to said base terminal to control the frequency of oscillation.

4. An oscillator circuit which utilizes a current dependent capacitance for providing a variable frequency of oscillation, comprising:

a transistor which supplies energy for establishing and sustaining oscillation and having a current dependent internal capacitance between base and emitter terminals thereof;

impedance means including a crystal and coupled to the collector terminal of said transistor for determining, together with said internal capacitance, the frequency of oscillation of the circuit;

and means coupled to the base and emitter terminals of said transistor for supplying a variable control current for varying the magnitude of said internal capacitance to control the frequency of oscillation.

5. An oscillator circuit which utilizes a current dependent capacitance for providing a variable frequency of oscillation, comprising:

a transistor which supplies energy for establishing and sustaining oscillation and having a current dependent internal capacitance between base and emitter terminals thereof;

impedance means coupled to the collector terminal of said transistor for determining, together with said internal capacitance, the frequency of oscillation of the circuit;

and means coupled to the base and emitter terminals of said transistor for supplying a variable control current for varying the magnitude of said internal capacitance to control the frequency of oscillation, said current supplying means including a source of control current and a capacitive element in parallel combination between a reference potential and one end of an inductive element, and the other end of the inductive element is coupled to the base terminal of said transistor so that the D-C portion of said control current flows through the inductive element to said base terminal to control the frequency of oscillation.

6. An oscillator circuit which utilizes a current dependent capacitance for providing a variable frequency of oscillation, comprising:

a transistor which supplies energy for establishing and sustaining oscillation and having a current dependent internal capacitance between base and emitter terminals thereof;

impedance means coupled to the collector terminal of said transistor for determining, together with said internal capacitance, the frequency of oscillation of the circuit;

and means coupled to the base and emitter terminals of said transistor for supplying a variable control current for varying the magnitude of said internal capacitance to control the frequency of oscillation, said current supplying means including a source of control current, operating as a current sink, and a capacitive element in parallel combination coupled between the emitter terminal of said transistor and a reference potential, and an inductive element coupled between the base terminal of said transistor and the reference potential for providing an impedance therebetween through which the control current is supplied to said base terminal to control the frequency of oscillation.

References Cited

UNITED STATES PATENTS

| | | | |
|---|---|---|---|
| 2,888,648 | 5/1959 | Herring | 332—16 |
| 3,260,960 | 7/1966 | Bangert | 331—177V |
| 3,076,945 | 2/1963 | Coombs | 331—177X |

OTHER REFERENCES

QST, August 1966, pp. 72–73.

ROY LAKE, Primary Examiner

S. H. GRIMM, Assistant Examiner

U.S. Cl. X.R.

331—117, 177; 332—30